(12) United States Patent
Oh et al.

(10) Patent No.: US 8,575,601 B2
(45) Date of Patent: Nov. 5, 2013

(54) ORGANIC LIGHT-EMITTING DISPLAY DEVICE AND METHOD OF MANUFACTURING THE SAME

(75) Inventors: Jae-Hwan Oh, Yongin (KR); Seong-Hyun Jin, Yongin (KR); Young-Jin Chang, Yongin (KR); Won-Kyu Lee, Yongin (KR); Jae-Beom Choi, Yongin (KR); Cheol-Ho Park, Yongin (KR)

(73) Assignee: Samsung Display Co., Ltd. (KR)

( * ) Notice: Subject to any disclaimer, the term of this patent is extended or adjusted under 35 U.S.C. 154(b) by 158 days.

(21) Appl. No.: 13/183,168

(22) Filed: Jul. 14, 2011

(65) Prior Publication Data

US 2012/0043546 A1   Feb. 23, 2012

(30) Foreign Application Priority Data

Aug. 17, 2010  (KR) .................. 10-2010-0079229

(51) Int. Cl.
*H01L 51/00* (2006.01)

(52) U.S. Cl.
USPC .................. 257/40; 257/E51.01; 438/98

(58) Field of Classification Search
USPC ................. 257/40, E51.01; 438/98
See application file for complete search history.

(56) References Cited

U.S. PATENT DOCUMENTS

| 6,849,922 B2* | 2/2005 | Park ................ 257/633 |
| 7,173,370 B2* | 2/2007 | Seo et al. ............ 313/504 |
| 2007/0278480 A1* | 12/2007 | Hwang et al. ......... 257/40 |
| 2010/0045576 A1* | 2/2010 | Park et al. ............ 345/76 |
| 2010/0171107 A1* | 7/2010 | Jung et al. ............ 257/40 |
| 2010/0177265 A1* | 7/2010 | Jung et al. ............ 349/69 |

FOREIGN PATENT DOCUMENTS

| KR | 10-2005-0036049 A | 4/2005 |
| KR | 10-2005-0045983 A | 5/2005 |
| KR | 10-2006-0042754 A | 5/2006 |

* cited by examiner

*Primary Examiner* — William D Coleman
(74) *Attorney, Agent, or Firm* — Knobbe, Martens, Olson & Bear LLP

(57) ABSTRACT

Disclosed is a method of manufacturing an organic light-emitting display device capable of improving efficiency of a laser generator used for crystallization of amorphous silicon. The method crystallizes amorphous silicon selectively to provide an organic light-emitting display device that includes channel area of a pixel contains polycrystalline silicon and storage area of the pixel contains amorphous silicon.

12 Claims, 12 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims the benefit of Korean Patent Application No. 10-2010-0079229, filed on Aug. 17, 2010, in the Korean Intellectual Property Office, the disclosure of which is incorporated herein in its entirety by reference.

BACKGROUND

1. Field of the Invention

The present invention relates to display technology, and more particularly, to organic light-emitting display devices.

2. Description of the Related Art

An active matrix (AM)-type organic light-emitting display device includes a plurality of pixels each including a pixel driving circuit including a thin-film transistor (TFT) formed of silicon. Amorphous silicon or polycrystalline silicon is used in the TFTs.

An amorphous silicon TFT (a-Si TFT) used in a pixel driving circuit has a low electron mobility of 1 $cm^2/Vs$ or less since a semiconductor activation layer that constitutes a source, a drain, and a channel is formed of a-Si. Recently, the a-Si TFT has been replaced with a polycrystalline silicon TFT (poly-Si TFT). The poly-Si TFT has higher electron mobility and higher stability with respect to light than the a-Si TFT. Accordingly, poly-Si is suitable for use in an activation layer of a driving and/or switching TFT of an AM organic light-emitting display device.

Poly-Si may be formed using various methods. The poly-Si formation may be largely divided into a method of directly depositing poly-Si and a method of depositing a-Si and crystallizing the a-Si.

Examples of the direct deposition method include chemical vapor deposition (CVD), Photo CVD, hydrogen radical (HR) CVD, electron cyclotron resonance (ECR) CVD, plasma enhanced (PE) CVD, and low pressure (LP) CVD.

Examples of the crystallization method in which a-Si is deposited and then crystallized include solid phase crystallization (SPC), excimer laser crystallization (ELC), metal induced crystallization (MIC), metal induced lateral crystallization (MILC), and sequential lateral solidification (SLS).

FIG. 1 is a schematic view of a crystallization device 9 for crystallizing deposited a-Si. The crystallization device 9 includes a laser generator 91 for generating a laser beam L, a focusing lens 92 for focusing the laser beam L emitted from the laser generator 91, and a reduction lens 93 for reducing the laser beam L that has passed through the focusing lens 92 by a given magnification.

In the laser generator 91, a laser beam L that is not processed is emitted from a light source and passes through an attenuator (not shown) so that intensity of energy of the laser beam L is controlled, and the controlled laser beam L is irradiated through the focusing lens 92.

Meanwhile, an x-y stage 94 on which a substrate 10 on which a-Si layer is deposited is located corresponding to the laser generator 91. In this case, in order to crystallize the entire area of the substrate 10, the x-y stage 94 need to be horizontally moved.

A method of crystallizing silicon using a conventional crystallization device as described above will now be described in detail. In order to deposit crystalline silicon on a substrate, an insulating layer (called "buffer layer, not shown) is formed on the substrate, and an a-Si layer is deposited on the buffer layer and crystallized with the application of a laser beam to the deposited a-Si layer. Typically, the a-Si layer is deposited on the substrate by CVD.

However, when crystallization is performed using a laser beam, the entire area of the substrate, that is, both a pixel area and a circuit area are crystallized. In the pixel area, a channel area, a storage area, and an emission area are all crystallized. In addition, due to the limited width of the laser beam, crystallization is performed while moving the laser generator or the substrate with respect to each other. However, organic light-emitting display devices are manufactured as large devices, and accordingly, the area to be crystallized is increased. Therefore, maintenance expenses for generating a laser beam by a laser generator are increased.

The foregoing discussion is to provide background information relating to the invention disclosed in this application and does not constitute an admission of prior art.

SUMMARY

One aspect of the present invention provides an organic light-emitting display device capable of improving efficiency of a laser used for crystallization and reducing a maintenance expense for generating the laser and a method of manufacturing the same.

According to an aspect of the present invention, there is provided an organic light-emitting display device including: a thin-film transistor including an activation layer, a gate electrode, and source and drain electrodes; an organic light-emitting device including a pixel electrode electrically connected to the thin-film transistor, an intermediate layer including an emissive layer, and an opposite electrode which are sequentially deposited in the stated order; a storage capacitor including a first capacitor electrode formed on the same plane as the activation layer and a second capacitor electrode that is separated from the first capacitor electrode by a first insulating layer and faces the first capacitor electrode; and a connection electrode electrically connecting the activation layer to the first capacitor electrode.

The activation layer includes polycrystalline silicon and the first capacitor electrode includes amorphous silicon. The connection electrode includes the same material on the same plane as the gate electrode. The first insulating layer covers the activation layer and the first capacitor electrode, and contact holes are formed in areas of the first insulating layer corresponding to the activation layer and the first capacitor electrode, and through the contact holes, the connection electrode electrically connects the activation layer to the first capacitor electrode. The connection electrode includes the same material on the same plane as the source and drain electrodes.

The organic light-emitting display device may further include a second insulating layer, wherein the first insulating layer and the second insulating layer cover the activation layer and the first capacitor electrode, and contact holes are formed in areas of the first insulating layer and the second insulating layer corresponding to the activation layer and the first capacitor electrode and through the contact holes, the connection electrode electrically connects the activation layer to the first capacitor electrode.

According to another aspect of the present invention, there is provided an organic light-emitting display device including: an activation layer formed on a substrate and a first capacitor electrode that is formed on the same plane as the activation layer and is spaced apart from the activation layer; a first insulating layer covering the activation layer and the first capacitor electrode; a gate electrode formed on the first insulating layer and a connection electrode that includes the same material on the same plane as the gate electrode, is spaced apart from the gate electrode, and electrically connects the activation layer to the first capacitor electrode; a second insulating layer covering the gate electrode and the connection electrode; source and drain electrodes formed on the second insulating layer and a second capacitor electrode that includes the same material on the same plane as the source and drain electrodes, and is spaced apart from the source and drain electrodes; and an organic light-emitting device including a pixel electrode electrically connected to the source and drain electrodes, an intermediate layer including an emissive layer, and an opposite electrode which are sequentially deposited in the stated order. The activation layer includes polycrystalline silicon and the first capacitor electrode includes amorphous silicon.

According to another aspect of the present invention, there is provided an organic light-emitting display device including: an activation layer formed on a substrate and a first capacitor electrode that is formed on the same plane as the activation layer and is spaced apart from the activation layer; a first insulating layer covering the activation layer and the first capacitor electrode; a gate electrode formed on the first insulating layer and a second capacitor electrode that includes the same material on the same plane as the gate electrode, and is spaced apart from the gate electrode; a second insulating layer covering the gate electrode and the second capacitor electrode; source and drain electrodes formed on the second insulating layer and a connection electrode that includes the same material on the same plane as the source and drain electrodes and electrically connects the activation layer to the first capacitor electrode; and an organic light-emitting device including a pixel electrode electrically connected to the source and drain electrodes, an intermediate layer including an emissive layer, and an opposite electrode which are sequentially deposited in the stated order. The activation layer includes polycrystalline silicon and the first capacitor electrode includes amorphous silicon.

According to another aspect of the present invention, there is provided an organic light-emitting display device including: a pixel area in which a plurality of pixels are formed, wherein each of the pixels includes a thin-film transistor, an organic light-emitting device electrically connected to the thin-film transistor, and a storage capacitor that is spaced apart from the thin-film transistor and is electrically connected to the thin-film transistor; and a circuit area located one a side of the pixel area and supplying a power signal and an electric signal to the pixel area, wherein a semiconducting layer formed in the circuit area includes polycrystalline silicon and a semiconducting layer formed in the pixel area is formed by alternately depositing polycrystalline silicon and amorphous silicon.

The thin-film transistor includes a semiconducting layer including polycrystalline silicon, and the storage capacitor includes a semiconducting layer including amorphous silicon. The semiconducting layer of the thin-film transistor is electrically connected to the semiconducting layer of the storage capacitor.

According to another aspect of the present invention, there is provided a method of manufacturing an organic light-emitting display device, the method including: depositing a semiconducting layer on a substrate; selectively crystallizing a portion of the semiconducting layer; patterning the semiconducting layer to form an activation layer and a first capacitor electrode; forming a first insulating layer having contact holes respectively exposing a portion of the activation layer and a portion of the first capacitor electrode; forming a gate electrode and a connection electrode contacting each of the exposed portion of the activation layer and the exposed portion of the first capacitor electrode; forming a second insulating layer having contact holes exposing portions of ends of the activation layer; and forming source and drain electrodes and a second capacitor electrode contacting the exposed portions of the activation layer.

In the selective crystallizing, an area of the semiconducting layer in which the activation layer is to be formed is crystallized. In the selective crystallizing, while a laser generator moves with respect to the substrate to perform crystallization, only when the laser generator passes an area of the semiconducting layer in which the activation layer is to be formed, the laser generator is turned on.

According to another aspect of the present invention, there is provided a method of manufacturing an organic light-emitting display device, wherein the method includes depositing a semiconducting layer on a substrate; selectively crystallizing a portion of the semiconducting layer; patterning the semiconducting layer to form an activation layer and a first capacitor electrode; forming a first insulating layer on the activation layer and the first capacitor electrode and a gate electrode and a second capacitor electrode on the first insulating layer; forming second insulating layer on the gate electrode and the second capacitor electrode; patterning the first insulating layer and the second insulating layer to form a first contact hole exposing portions of ends of the activation layer and a second contact hole exposing a portion of each of the activation layer and the first capacitor electrode; and forming source and drain electrodes contacting the exposed portions of the activation layer and a connection electrode contacting the exposed portion of each of the activation layer and the first capacitor electrode.

In the selective crystallizing, an area of the semiconducting layer in which the activation layer is to be formed is crystallized. In the selective crystallizing, while a laser generator moves with respect to the substrate to perform crystallization, only when the laser generator passes an area of the semiconducting layer in which the activation layer is to be formed, the laser generator is turned on.

According to another aspect of the present invention, there is provided a method of manufacturing an organic light-emitting display device including a pixel area and a circuit area, wherein the method includes when crystallization is performed on a semiconducting layer in the circuit area, crystallization is performed while a laser generator continues to be turned on, and when crystallization is performed on a semiconducting layer in the pixel area, crystallization is performed while the laser generator is periodically turned on and off.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Figure 1:
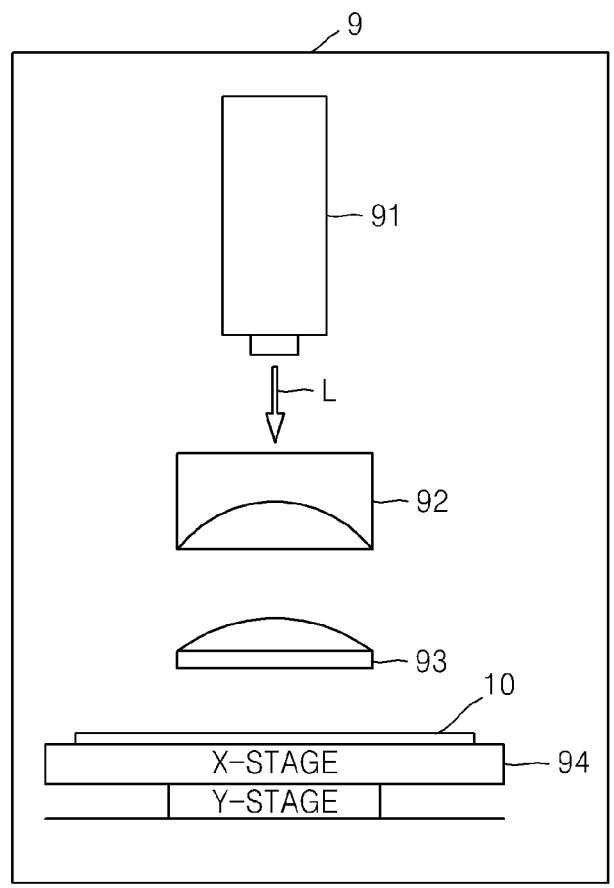
FIG. 1 is a schematic view of a crystallization device for crystallizing deposited amorphous silicon (a-Si)

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Figure 2:
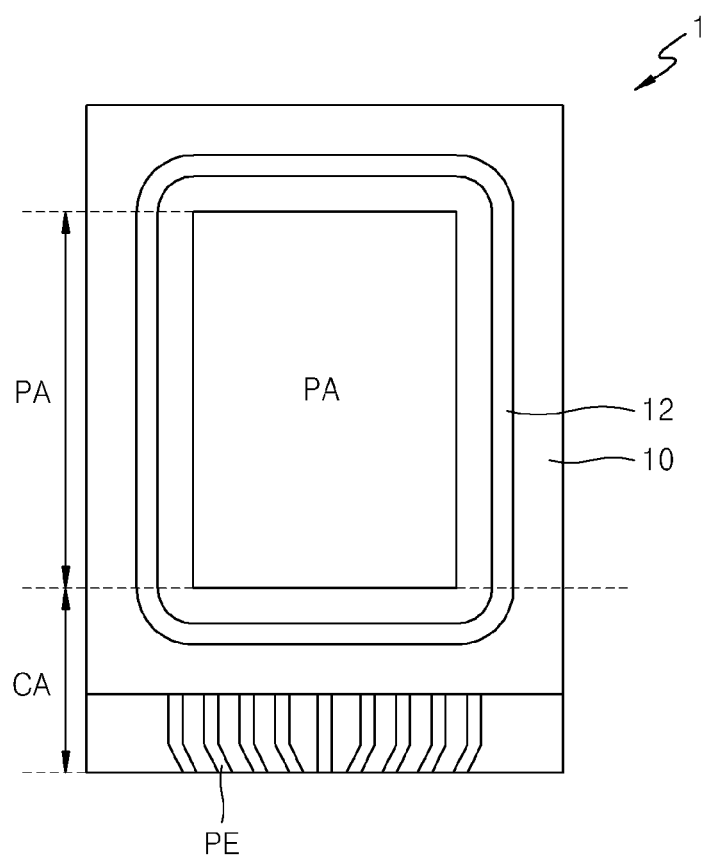
FIG. 2 is a schematic plane view of an organic light-emitting display device according to an embodiment of the present invention.

FIG. 2 is a schematic plane view of an organic light-emitting display device 1 according to an embodiment of the present invention. The organic light-emitting display device 1 according to the present embodiment includes a first substrate 10 including a thin-film transistor (TFT) and a luminous pixel, and a second substrate (not shown) that is coupled to the first substrate 10 by sealing. For example, a TFT, an organic light-emitting device (EL), and a storage capacitor Cst may be formed on the first substrate 10. The first substrate 10 may be a low-temperature poly-silicon (LTPS) substrate, a glass substrate, a plastic substrate, or a stainless steel (SUS) substrate.

The second substrate may be an encapsulation substrate that is disposed on the first substrate 10 and blocks permeation of external water molecules and the air into, for example, the TFT and the luminous pixel formed on the first substrate 10. The second substrate is located facing the first substrate 10, and the first substrate 10 is coupled to the second substrate with sealing 12 formed along the edges of the first substrate 10. The second substrate may be a transparent glass substrate or transparent plastic substrate.

The first substrate 10 may include a pixel area PA from which light is emitted and a circuit area CA located outside the pixel area PA. According to embodiments of the present invention, the sealing 12 is formed outside the pixel area PA and is used to couple the first substrate 10 to the second substrate.

As described above, an organic light-emitting device (EL), a TFT for driving the organic light-emitting device, and an interconnection line electrically connected to the organic light-emitting device and the TFT are formed in the pixel area PA of the first substrate 10. The pixel area PA includes an array of organic light-emitting pixels arranged to display information and data. In the circuit area CA, there is a pad electrode PE extending from the interconnection line of the pixel area PA.

In regard to the organic light-emitting display device 1, a semiconducting layer formed in the pixel area PA is subjected to full crystallization, and a semiconducting layer formed in the circuit area CA is subjected to selective crystallization.

In detail, according to a conventional crystallization method using a laser beam, the entire area of a substrate including the pixel area and the circuit area is crystallized, and in the pixel area, a channel area, a storage area, and an emission area all are crystallized. However, an organic light-emitting display device is manufactured as a large device and accordingly, an area to be crystallized is increased. Therefore, a maintenance expense for generating a laser beam by a laser generator is increased and productivity is decreased.

In order to solve the problems described above, according to embodiments, full crystallization is performed for the circuit area CA, where high electron mobility is needed, and selective crystallization is performed for the pixel area PA, where high electron mobility is needed only in some portions, for example, TFTs. That is, only the particular portion requiring high electron mobility is crystallized. The full crystallization and selective crystallization may be performed by turning on or off a laser. More specifically, when the circuit area CA is crystallized, the laser generator is turned on and crystallization is performed while the substrate 10 or the laser generator is moving with respect to each other. On the other hand, when the pixel area PA is crystallized, the laser generator is selectively turned on and off. For example, the laser generator is turned off when the laser generator passes areas that do not require high electron mobility and remains turned off until the laser generator reaches or focuses areas, e.g., TFTs that require high electron mobility. When the laser generator passes or focuses TFTs, the laser generator is turned on and performs crystallization on the TFT.

Figure 3:
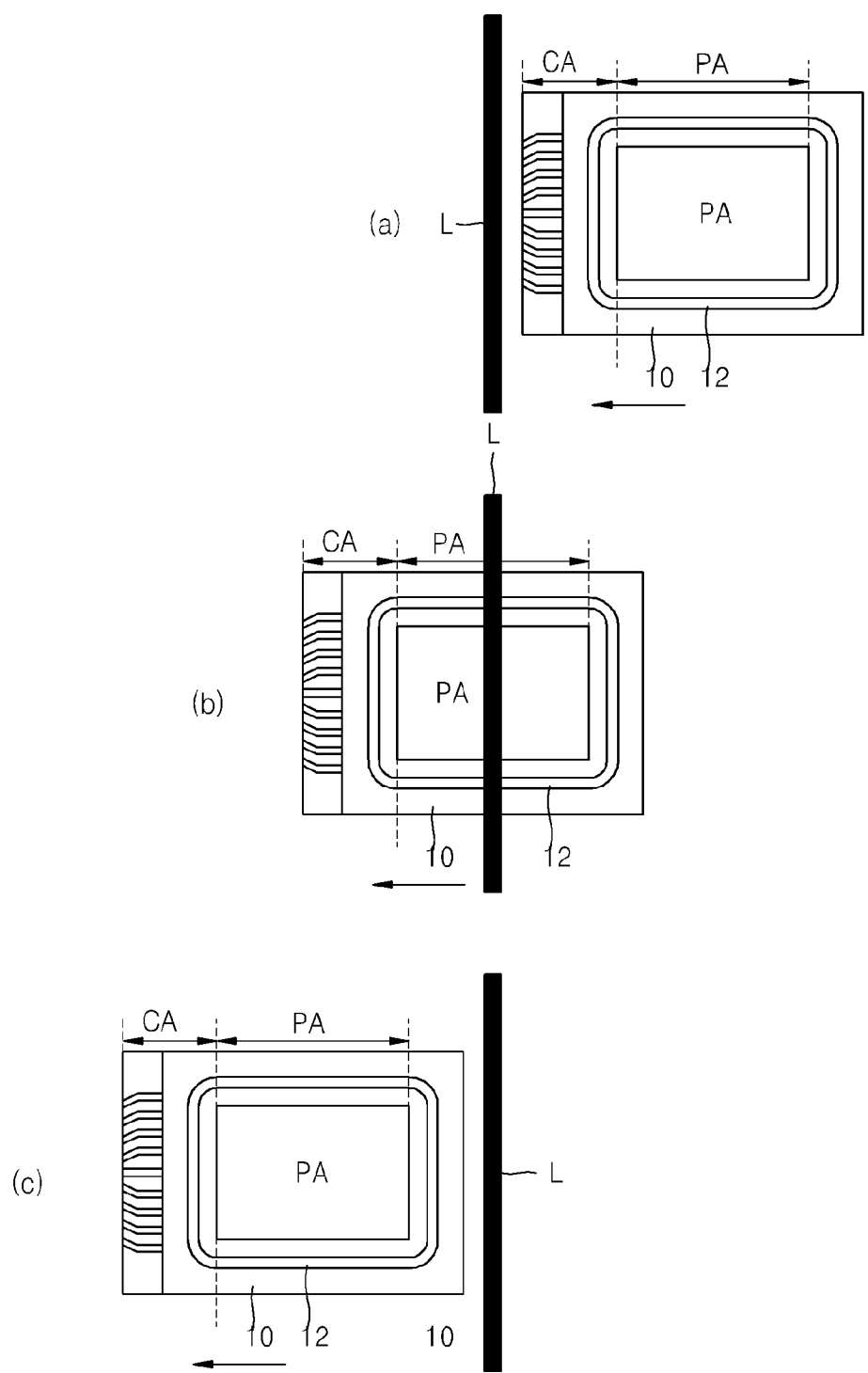
FIG. 3 illustrates a process for crystallizing a substrate by irradiation of a laser beam by a laser generator, according to an embodiment of the present invention.

Referring to FIGS. 3A through 3C, when the substrate 10 moves with respect to the laser generator (not shown) and the circuit area CA of the substrate 10 passes a laser beam L irradiated by the laser generator, the substrate 10 is crystallized while the laser generator is turned on. On the other hand, when the laser generator moves over the pixel area PA of the substrate 10, the laser generator is turned off and in this state, the substrate 10 moves in a direction indicated by an arrow until the laser generator reaches an area to be crystallized, for example, the TFT, and then the laser generator is turned on and performs crystallization on the TFT.

As described above, since the pixel area PA and the circuit area CA are crystallized using different crystallization methods, that is, the circuit area CA is subjected to the full crystallization and the pixel area PA is subjected to the selective crystallization, efficiency of the laser generator is maximized, the operating costs can be reduced.

Figure 4:
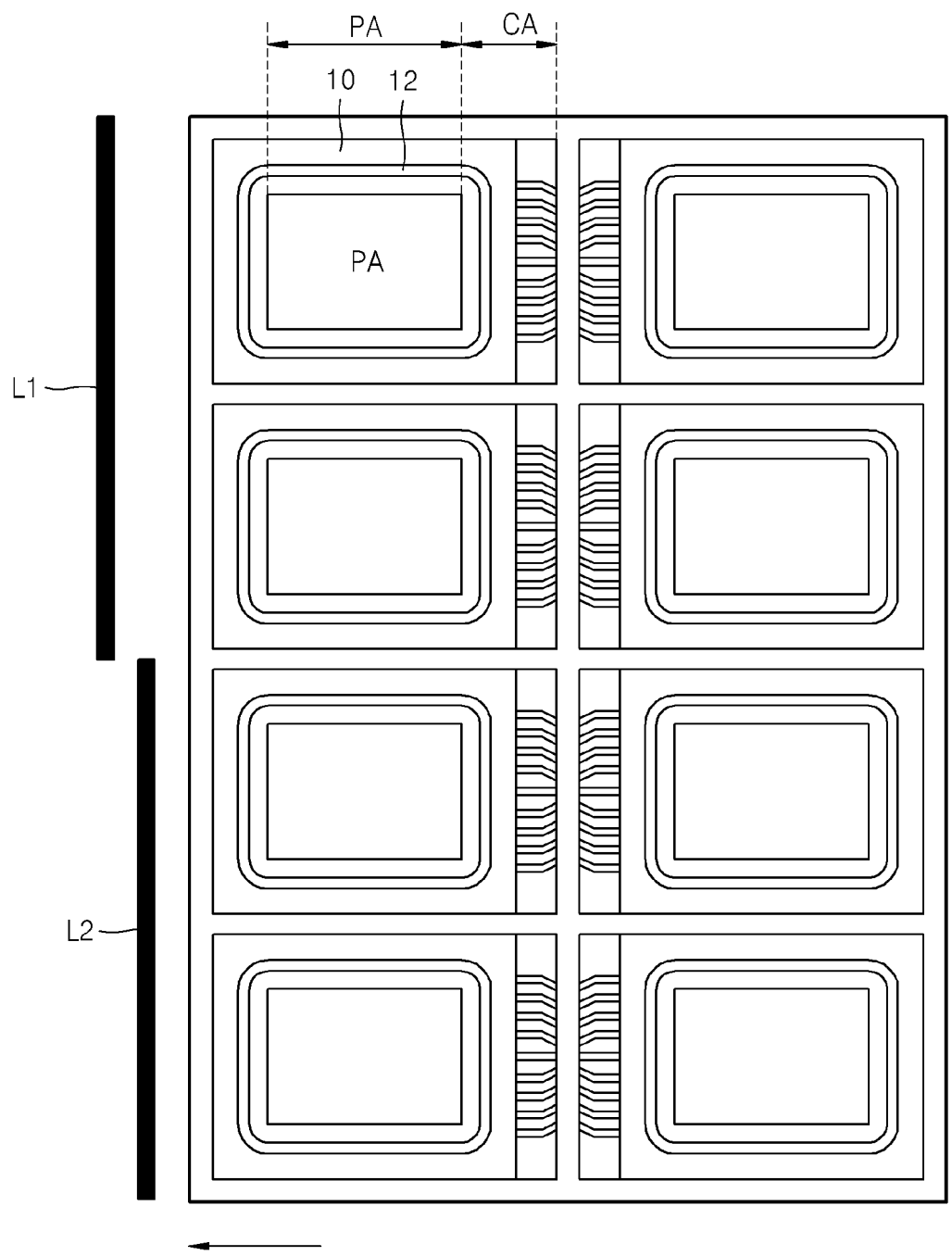
FIG. 4 illustrates a process for crystallizing a substrate by irradiation of a laser beam by a laser generator, according to another embodiment of the present invention.

FIG. 4 illustrates a process for crystallizing the substrate 10 by irradiation of the laser beam L by the laser generator, according to another embodiment of the present invention. Referring to FIG. 4, when an organic light-emitting display device is manufactured as a large device, a plurality of panels (that is, a plurality of organic light-emitting display devices) may be formed on a mother glass. In this case, as illustrated in FIG. 4, when the panels are aligned in two columns, the panels are oriented such that circuit areas CA of two neighboring panels of a row are located next to each other. In this arrangement of panels, two circuit areas CA of the two neighboring panels can be crystallized continuously without turning off while crystallizing the two circuit areas of a single row.

Hereinafter, one pixel of the pixel area PA of the organic light-emitting display device 1 will be described in detail.

Figure 5:
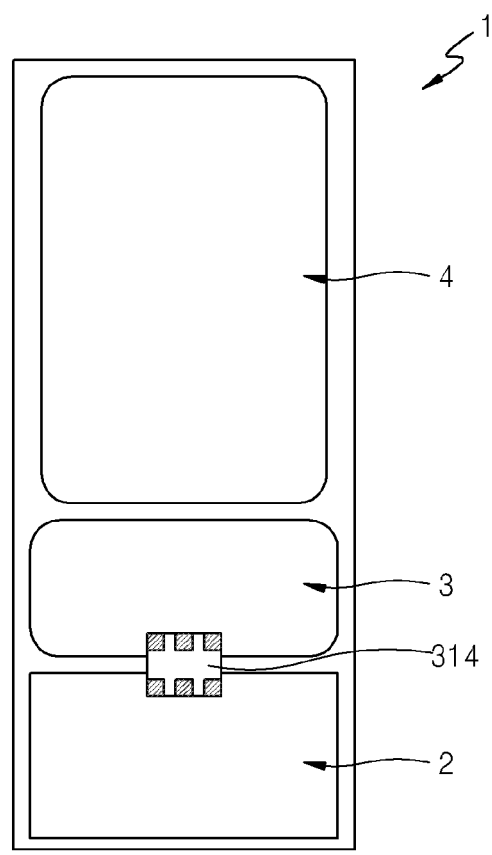
FIG. 5 is a plane view of a pixel that constitutes the organic light-emitting display device of FIG. 2, according to an embodiment of the present invention.
Figure 6:
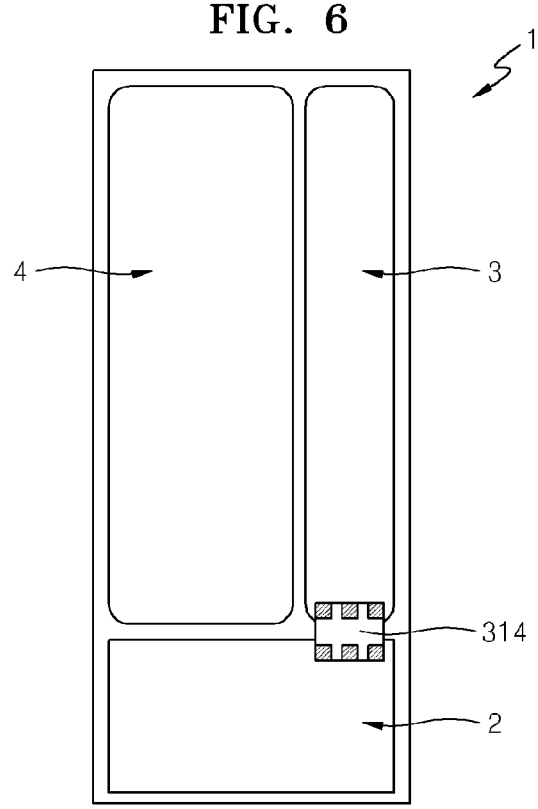
FIG. 6 is a plane view of a pixel that constitutes the organic light-emitting display device of FIG. 2, according to another embodiment of the present invention.

FIG. 5 is a plane view of a pixel that constitutes the organic light-emitting display device 1 of FIG. 2, according to an embodiment of the present invention, and FIG. 6 is a plane view of a pixel that constitutes the organic light-emitting display device 1 of FIG. 2, according to another embodiment of the present invention.

Referring to FIGS. 5 and 6, the pixel of the organic light-emitting display device 1 includes a channel area 2, a storage area 3, and an emission area 4. In FIG. 5, the channel area 2, the storage area 3, and the emission area 4 are aligned parallel to each other, and in FIG. 6, the storage area 3 and the emission area 4 are formed long in their lengthwise directions and neighbor each other, and the channel area 2 is located on a side of each of the storage area 3 and the emission area 4 and neighbors with each of the storage area 3 and the emission area 4.

In this case, as illustrated in FIGS. 5 and 6, even in one pixel, only the channel area 2 and the storage area 3 require high electron mobility, and the emission area 4, which occupies more than half the entire area of the pixel, does not require high electron mobility. Accordingly, there is a need to crystallize only the channel area 2 and the storage area 3. However, the storage area 3 also occupies a wide space similar to that required for the channel area 2. Thus, if the storage area 3 is not crystallized and amorphous silicon is used to form an electrode in the storage area 3, crystallization needs to be performed only on the channel area 2, which is just a small part of the entire region of the pixel. Therefore, a laser maintenance expense may be reduced and a laser may be efficiently used.

To do this, in the organic light-emitting display device 1, only a semiconducting layer formed in the channel area 2 is selectively crystallized so as to form an activation layer formed of polycrystalline silicon, and a semiconducting layer formed in the storage area 3 is not crystallized so as to form a first capacitor electrode formed of amorphous silicon. A contact hole is formed in an insulating layer covering the activation layer and the first capacitor electrode, and the activation layer is electrically connected to the first capacitor electrode through the contact hole, thereby allowing the first capacitor electrode to perform as an electrode. This structure described above will be now described in detail.

Figure 7:
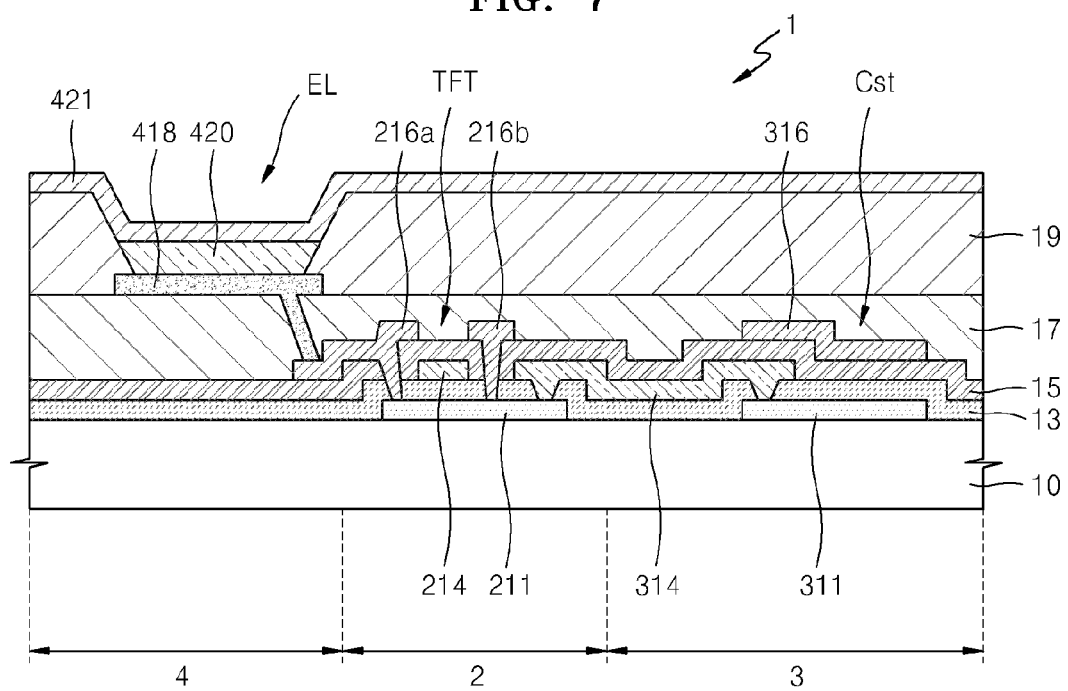
FIG. 7 is a sectional view of a pixel that constitutes the organic light-emitting display device of FIG. 2, according to an embodiment of the present invention.

FIG. 7 is a sectional view of a pixel that constitutes the organic light-emitting display device 1 of FIG. 2, according to an embodiment of the present invention. Referring to FIG. 7, the pixel of the organic light-emitting display device 1 includes a channel area 2, a storage area 3, and an emission area 4.

A TFT as a driving device is formed in the channel area 2. The TFT includes an activation layer 211, a gate electrode 214, and source and drain electrodes 216a and 216b. A first insulating layer 13 is interposed between the gate electrode 214 and the activation layer 211 so that the gate electrode 214 is insulated from the activation layer 211. In addition, source and drain areas in which high-concentration impurities are implanted are formed in ends of the activation layer 211 and are respectively connected to the source and drain electrodes 216a and 216b.

A storage capacitor Cst is formed in the storage area 3. The storage capacitor Cst includes a first capacitor electrode 311 and a second capacitor electrode 316, and the first insulating layer 13 is interposed between the first capacitor electrode 311 and the second capacitor electrode 316. The first capacitor electrode 311 may be formed of the same material on the same plane as the activation layer 211 of the TFT. Also, the second capacitor electrode 316 may be formed of the same material on the same plane as the source and drain electrodes 216a and 216b of the TFT.

In the present embodiment, the activation layer 211 of the channel area 2 is formed of polycrystalline silicon, and the first capacitor electrode 311 of the storage area 3 that is formed on the same plane as the activation layer 211 is formed of amorphous silicon. That is, a semiconducting layer formed of amorphous silicon is deposited on the substrate 10, and then crystallization is selectively performed so that the amorphous silicon in the channel area 2 (activation layer 211) is crystallized into polycrystalline silicon and the amorphous silicon in the storage area 3 (first capacitor electrode 311) is not crystallized.

Figure 13:
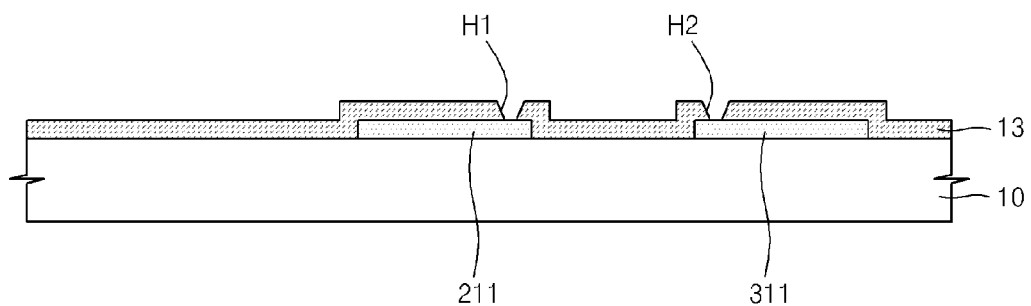

Also, the organic light-emitting display device 1 may further include a connection electrode 314 that electrically connects the activation layer 211 of the channel area 2 and the first capacitor electrode 311 of the storage area 3. Referring to FIG. 13, contact holes H1 and H2 are formed in the first insulating layer 13 covering the activation layer 211 of the channel area 2 and the first capacitor electrode 311 of the storage area 3, and then the contact holes H1 and H2 are filled with the material of the connection electrode 314 formed on the first insulating layer 13 so that the activation layer 211 of the channel area 2 is electrically connected to the first capacitor electrode 311 of the storage area 3. In embodiments, the connection electrode 314 may be formed of the same material on the same plane as the gate electrode 214 of the channel area 2.

An organic light-emitting device EL is formed in the emission area 4. The organic light-emitting device EL includes a pixel electrode 418 connected to one of the source and drain electrodes 216a and 216b of the TFT, an opposite electrode (common electrode) 421 facing the pixel electrode 418, and an intermediate layer 420 interposed between the pixel electrode 418 and the opposite electrode 421. The pixel electrode 418 may be formed of a transparent conductive material.

Figure 8:
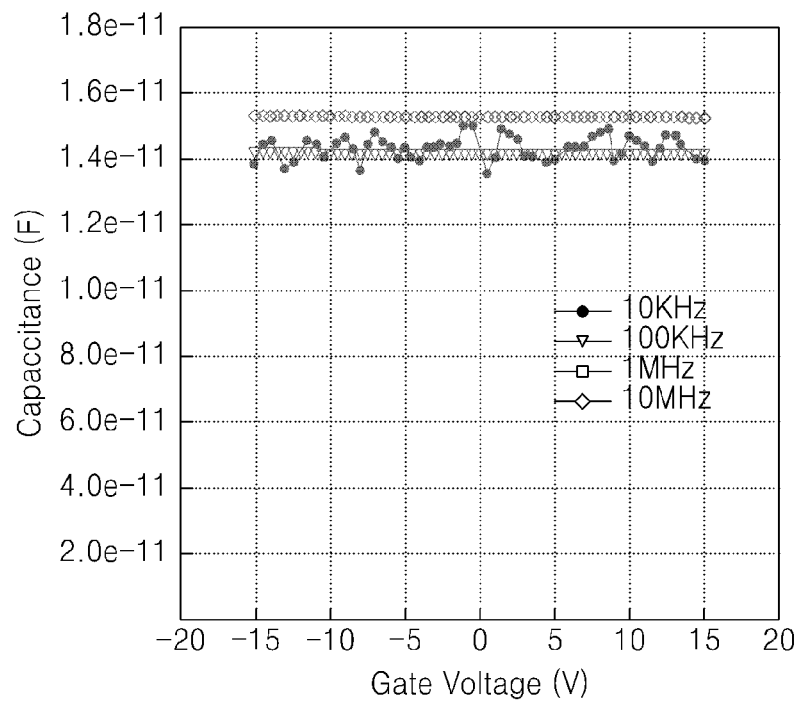
FIG. 8 is a graph of a capacitance with respect to a voltage of a capacitor electrode in a storage area when the capacitor electrode is formed of polycrystalline silicon.
Figure 9:
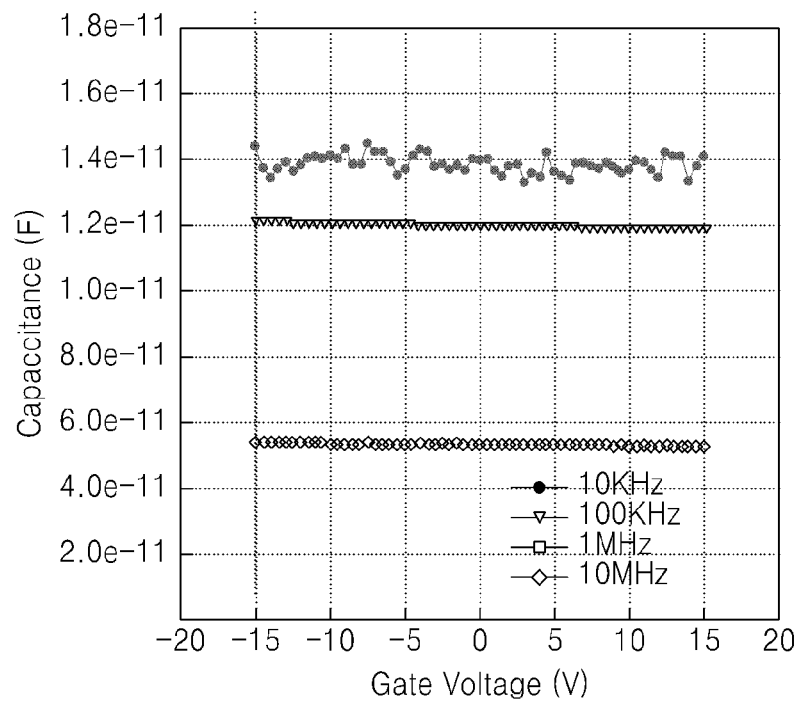
FIG. 9 is a graph of a capacitance with respect to a voltage of a capacitor electrode in a storage area when the capacitor electrode is formed of amorphous silicon and is electrically connected to an activation layer in a channel area.

FIG. 8 is a graph of capacitance of the storage capacitor Cst with respect to the voltage of capacitor electrode 311 in the storage area 3 when the capacitor electrode 311 is formed of polycrystalline silicon. FIG. 9 is a graph of capacitance of the storage capacitor Cst with respect to the voltage of capacitor electrode 311 in the storage area 3 when the capacitor electrode 311 is formed of amorphous silicon and is electrically connected to the activation layer 211 in a channel area, according to an embodiment of the present invention.

Referring to FIG. 8, when the capacitor electrode 311 of the storage area 2 is formed of polycrystalline silicon, the capacitance of a storage capacitor Cst is about $1.4e^{-11}$ F to about $1.6e^{-11}$. Referring to FIG. 9, when the capacitor electrode 311 of the storage area 3 is formed of amorphous silicon and is electrically connected to the activation layer of the channel area, the capacitance of a storage capacitor Cst is about $0.6e^{-11}$ F to $1.6e^{-11}$. The capacitance of FIG. 9 is slightly less than the capacitance of FIG. 8, but still enough for use as the storage capacitor Cst. These experimental results indicate that the electrical connection between the activation layer 211 of the channel area 2 and the first capacitor electrode 311 of the storage area 3 enables use of amorphous silicon instead of polycrystalline silicon in the capacitor electrode of the storage area 3.

Hereinafter, a method of manufacturing the organic light-emitting display device 1 of FIG. 7, which is a bottom emission type, will be described in detail. FIGS. 10 through 20 are sectional views schematically illustrating a method of manufacturing the organic light-emitting display device 1 of FIG. 7.

Figure 10:
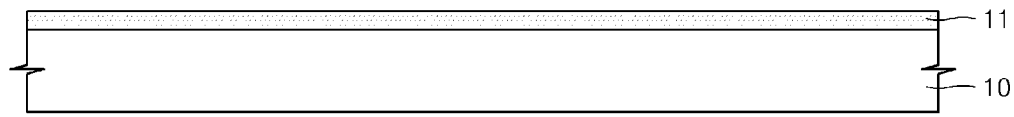
FIGS. 10 through 20 are sectional views schematically illustrating a method of manufacturing the organic light-emitting display device of FIG. 7.

First, as illustrated in FIG. 10, the semiconducting layer 11 is deposited on the substrate 10. In embodiments, the substrate 10 may be formed of a transparent glass material mainly composed of $SiO_2$. However, the substrate 10 is not necessarily limited thereto and may be instead formed of various other materials such as a transparent plastic material or a metal. Then, a semiconducting or semiconductive layer 11 is formed over the substrate 10. The semiconducting layer 11 may be formed by, for example, chemical vapor deposition (CVD), Photo CVD, hydrogen radical (HR) CVD, electron cyclotron resonance (ECR) CVD, plasma enhanced (PE) CVD, or low pressure (LP) CVD. In this regard, the semiconducting layer 11 may be an amorphous silicon layer.

Also, before the semiconducting layer 11 is deposited, an insulating layer (not shown) may be formed over the substrate 10 as a barrier layer or a buffer layer for preventing diffusion of impurity ions, preventing permeation of water molecules and an external gas, and planarizing a surface of the substrate 10. The insulating layer may be formed of depositing, for example, $SiO_2$ and/or $SiN_x$, on the substrate 10 by any one of various deposition methods including plasma enhanced chemical vapor deposition (PECVD), atmospheric pressure CVD (APCVD), and low pressure CVD (LPCVD).

Figure 11:
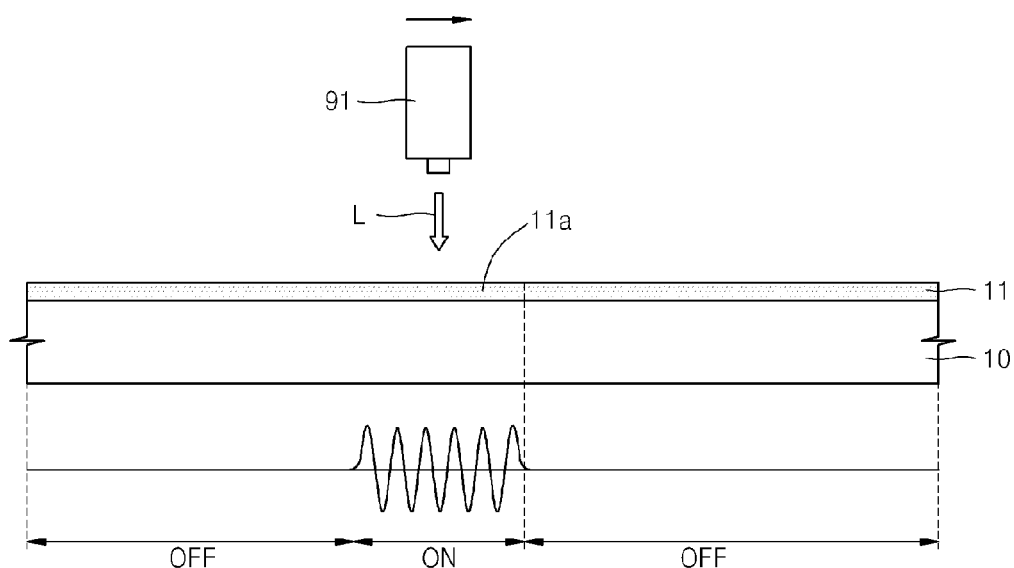

Next, as illustrated in FIG. 11, a laser generator 91 moves relative to the substrate 10 over the substrate 10, while radiating one or more laser beams to the substrate 10. The laser generator 91 is selectively turned on and off during the movement relative to the substrate 10 so as to crystallize selective areas of the semiconducting layer 11. In the illustrated embodiment, only the area 11a is crystallized and becomes the activation layer 211 (see also FIG. 7) of the channel area 2. Similarly, selected areas of the substrate 10 are crystallized with selective turning on and off of the laser generator 91 while moving relative to the substrate 10. In FIG. 11, a waveform of a laser beam in only one pixel is illustrated. However, when the laser generator 91 passes other pixels, the waveform of the laser beam of FIG. 11 may repeatedly occur.

The semiconducting layer 11 may be crystallized by, for example, rapid thermal annealing (RTA), solid phase crystallization (SPC), excimer laser annealing (ELA), metal induced crystallization (MIC), metal induced lateral crystallization (MILC), or sequential lateral solidification (SLS).

Figure 12:
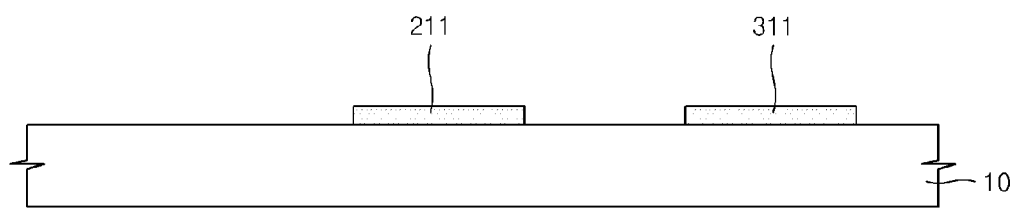

Subsequently, as illustrated in FIG. 12, the semiconducting layer 11 is patterned to form the activation layer 211 of the TFT and the first capacitor electrode 311 of the storage capacitor Cst. That is, the semiconducting layer 11 may be patterned to form the activation layer 211 of the TFT and the first capacitor electrode 311 of the storage capacitor Cst by using a mask process using a first mask (not shown). In embodiments, the activation layer 211 of the TFT is formed of polycrystalline silicon and the first capacitor electrode 311 of the storage capacitor Cst is formed of amorphous silicon. In the present embodiment, the activation layer 211 and the first capacitor electrode 311 are spaced from each other. However, in another embodiment, the activation layer 211 and the first capacitor electrode 311 may be formed as one body.

Then, as illustrated in FIG. 13, the first insulating layer 13 is formed on the entire surface of the substrate 10 on which the activation layer 211 and the first capacitor electrode 311 are formed, and then contact holes H1 and H2 are formed in the first insulating layer 13. In embodiments, the first insulating layer 13 may be formed by depositing an inorganic insulating material, such as $SiN_x$ or $SiO_x$, by PECVD, APCVD, or LPCVD. The first insulating layer 13 is interposed between the activation layer 211 and the gate electrode 214 of the TFT and functions as a gate insulating layer of the TFT, and also interposed between the second capacitor electrode 315 and the first capacitor electrode 311 and functions as a dielectric layer of the capacitor Cst. Then, the first insulating layer 13 is patterned using a mask process using a second mask (not shown) so as to form contact holes H1 and H2. In embodiments, the contact hole H1 exposes a portion of the activation layer 211, and the contact hole H2 exposes a portion of the first capacitor electrode 311.

Figure 14:
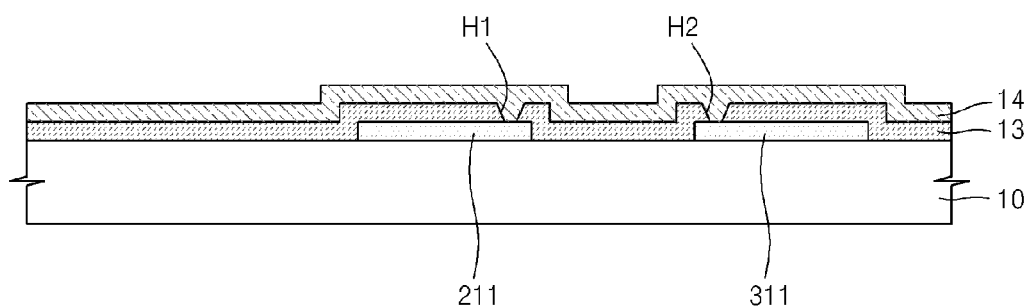

Then, as illustrated in FIG. 14, a first conductive layer 14 is deposited on the first insulating layer 13. In embodiments, the first conductive layer 14 may include at least one transparent material selected from the group consisting of ITO, IZO, ZnO, and $In_2O_3$. Alternately, the first conductive layer 14 may include at least one material selected from the group consisting of Ag, Mg, Al, Pt, Pd, Au, Ni, Nd, Ir, Cr, Li, Ca, Mo, Ti, W, MoW, and Al/Cu. The first conductive layer 14 may have such a thickness that the first conductive layer 14 sufficiently fills the contact holes H1 and H2.

Figure 15:
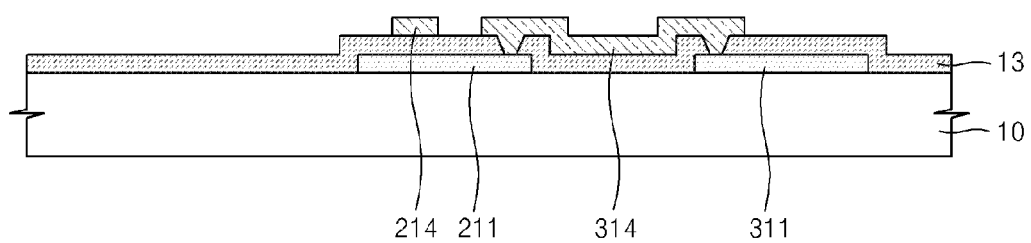

Subsequently, as illustrated in FIG. 15, the first conductive layer 14 is patterned to form the gate electrode 214 and the connection electrode 314 of the TFT. That is, the first conductive layer 14 is patterned to form the gate electrode 214 and the connection electrode 314 of the TFT by using a mask process using a third mask (not shown). The connection electrode 314 electrically connects the activation layer 211 to the first capacitor electrode 311, and enables the first capacitor electrode 311 formed of amorphous silicon to function as an electrode.

Figure 16:
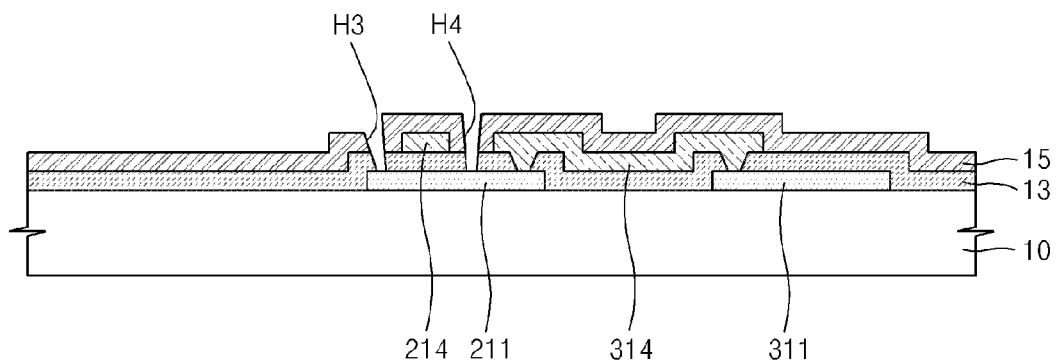

Then, as illustrated in FIG. 16, a second insulating layer 15 is deposited on the entire surface of the substrate 10 on which the first insulating layer 13, the gate electrode 214, and the connection electrode 314 are formed, and then, contact holes H3 and H4 are formed in the second insulating layer 15.

The second insulating layer 15 may be formed by, for example, spin coating at least one organic insulating material selected from the group consisting of polyimide, polyamide, an acryl resin, benzocyclobuten, and a phenol resin. The second insulating layer 15 may have a sufficient thickness. For example, the thickness of the second insulating layer 15 may be greater than the thickness of the first insulating layer 13 and functions as an interlayer insulating layer between the gate electrode 214 and the source and drain electrodes (see 216a and 216b of FIG. 7) of the TFT. Alternately, the second insulating layer 15 may be formed of inorganic insulating materials used for forming the first insulating layer 13, instead of the organic insulating materials described above. Alternately, the second insulating layer 15 may be formed by alternately depositing an organic insulating material and an inorganic insulating material.

The second insulating layer 15 is patterned using a mask process using a fourth mask (not shown) to form contact holes H3 and H4. In embodiments, the contact holes H3 and H4 expose portions of source and drain areas in ends of the activation layer 211.

Figure 17:
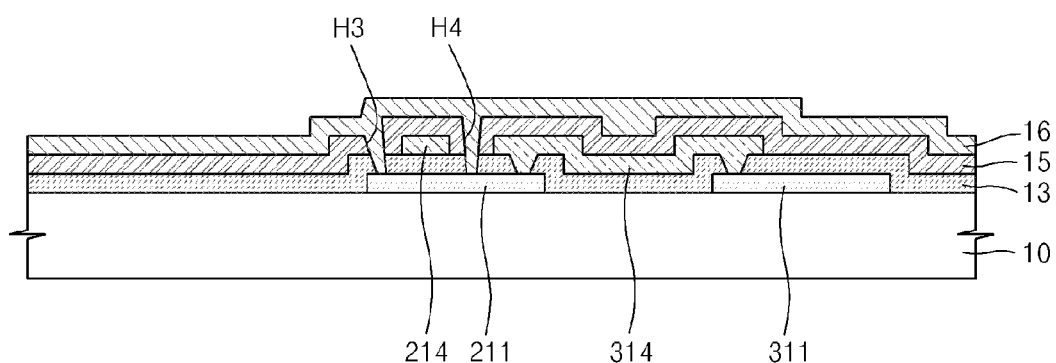

Then, as illustrated in FIG. 17, the second conductive layer 16 is deposited on the entire surface of the substrate 10 to cover the second insulating layer 15. The second conductive layer 16 may be formed of at least one material selected from the group consisting of the conductive materials used to form the first conductive layer 14. However, the second conductive layer 16 may instead be formed of various other conductive materials. The second conductive layer 16 may have such a thickness that the second conductive layer 16 fills the contact holes H3 and H4.

Figure 18:
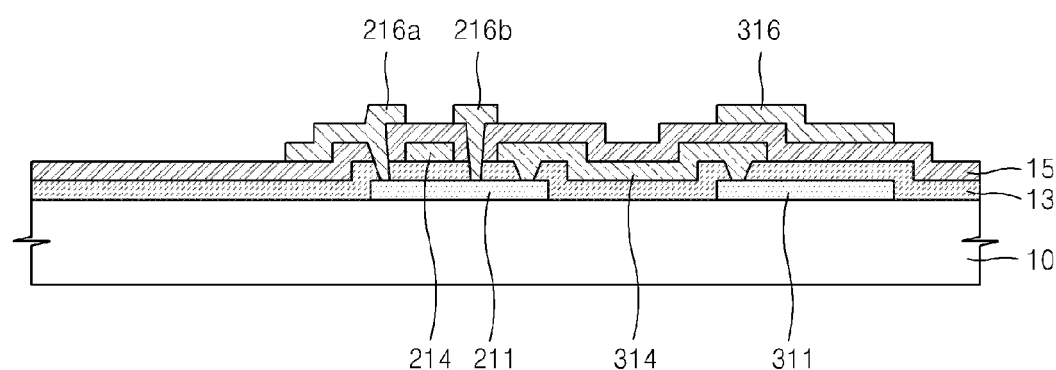

Then, as illustrated in FIG. 18, the second conductive layer (see 16 of FIG. 17) is patterned to form the source and drain electrodes 216a and 216b and the second capacitor electrode 316. In embodiments, the second conductive layer (see 16 of FIG. 17) is patterned using a mask process using a fifth mask (not shown) to form the source and drain electrodes 216a and 216b and the second capacitor electrode 316. Accordingly, the source and drain electrodes 216a and 216b and the second capacitor electrode 316 are formed of the same material on the same plane.

Figure 19:
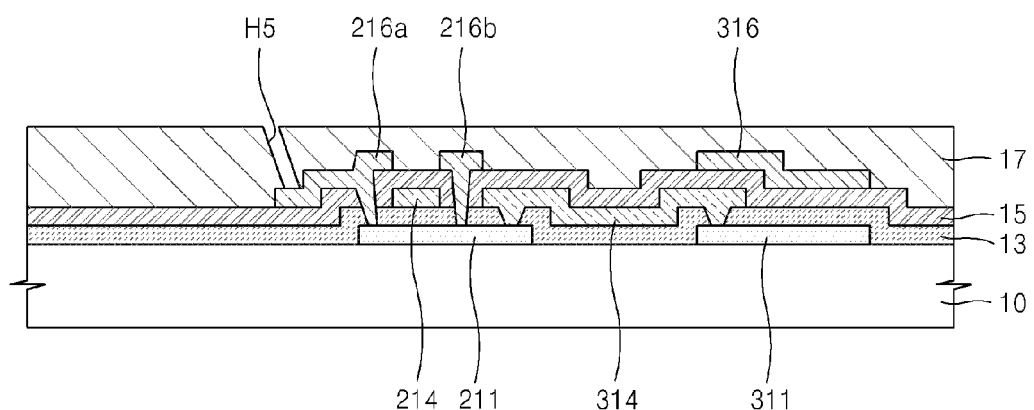

Then, as illustrated in FIG. 19, a third insulating layer 17 is deposited on the entire surface of the substrate 10 on which the second insulating layer 15, the source and drain electrodes 216a and 216b, and the second capacitor electrode 316 are formed, and then a contact hole H5 is formed in the third insulating layer 17. In embodiments, the third insulating layer 17 may be formed by depositing an inorganic insulating material, such as $SiN_x$ or $SiO_x$, by PECVD, APCVD, or LPCVD. The third insulating layer 17 may function as a passivation layer. The third insulating layer 17 is patterned using a mask process using a sixth mask (not shown) to form a contact hole H5. In embodiments, the contact hole H5 may expose a portion of the source and drain electrodes 216a and 216b.

Figure 20:
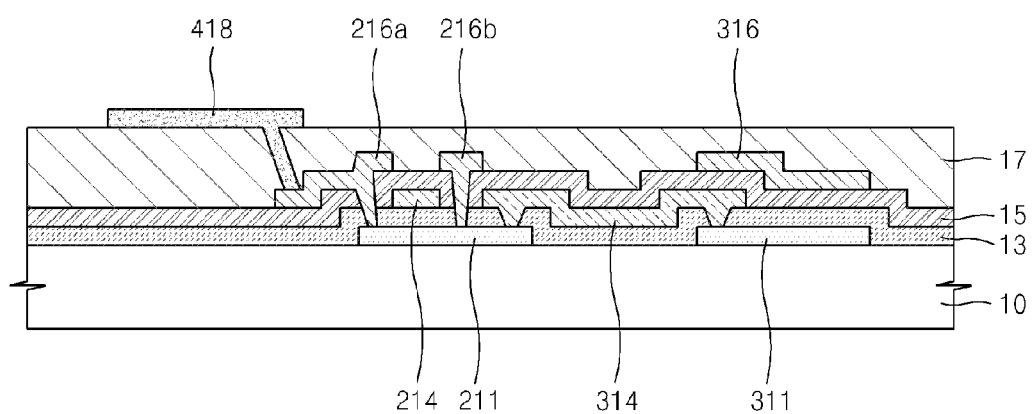

Then, as illustrated in FIG. 20, a fourth conductive layer (not shown) covering the third insulating layer 17 is deposited on the entire surface of the substrate 10, and then patterned to form the pixel electrode 418. Then, as illustrated in FIG. 7, a pixel define layer (PDL) 19 covering ends of the pixel electrode 418 is formed, and then, the intermediate layer 420 including an organic emissive layer and the opposite electrode 421 are formed in an emission area defined by the PDL 19. The intermediate layer 420 may include an emissive layer (EML), and at least one layer selected from the group consisting of a hole transport layer (HTL), a hole injection layer (HIL), an electron transport layer (ETL), and an electron injection layer (EIL), wherein each layer may have a monolayer structure or a multi-layer structure.

The intermediate layer 420 may be formed of a low molecular weight organic material or a polymer organic material. When the intermediate layer 420 is formed of a low molecular weight organic material, the intermediate layer 420 may include a HTL and a HIL sequentially deposited in the stated order in a direction from the EML to the pixel electrode 418, and an ETL and an EIL sequentially deposited in the stated order in a direction from the EML to the opposite electrode 421. The intermediate layer 420 may further include various other layers according to a purpose. In embodiments, an available organic material may be, for example, copper phthalocyanine (CuPc), N,N'-Dinaphthalene-1-yl-N,N'-diphenyl-benzidine (NPB), or tris-8-hydroxyquinoline aluminum (Alq3).

Also, when the intermediate layer 420 is formed of a polymer organic material, the intermediate layer 420 may include only a HTL in a direction from the EML to the pixel electrode 418. The HTL may be formed by ink-jet printing or spin coating poly-2,4-ethylene-dihydroxy thiophene (PEDOT) or polyaniline (PANI) on the pixel electrode 418. In embodiments, an available organic material may be, for example, a poly-phenylenevinylene (PPV)-based organic material or a polyfluorene-based organic material, and a color pattern may be formed using a conventional method such as ink-jet printing, spin coating, or thermal transferring using a laser.

In some embodiments, the opposite electrode 421 may be deposited on the entire surface of the substrate 10 and functions as a common electrode. In the organic light-emitting display device 1, the pixel electrode 418 is used as an anode, and the opposite electrode 421 is used as a cathode. Alternately, in another embodiment, the pixel electrode 418 may be used as a cathode, and the opposite electrode 421 may be used as an anode.

If the organic light-emitting display device 1 is a bottom emission-type organic light-emitting display device in which an image is formed toward the substrate 10, the pixel electrode 418 may be a transparent electrode and the opposite electrode 421 may be a reflective electrode. In embodiments, the reflective electrode may be formed by depositing a metal having a low work function, for example, Ag, Mg, Al, Pt, Pd, Au, Ni, Nd, Ir, Cr, Li, Ca, LiF/Ca, LiF/Al, or a combination thereof, and the formed reflective electrode may have a small thickness.

Figure 21:
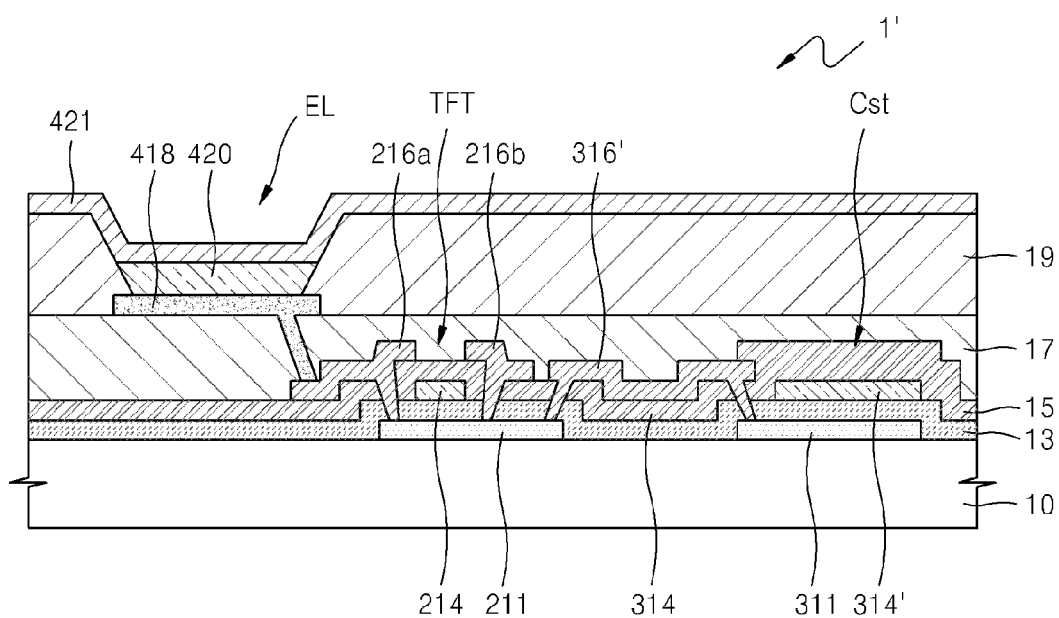
FIG. 21 is a sectional view of a pixel that constitutes the organic light-emitting display device of FIG. 2, according to another embodiment of the present invention.

FIG. 21 is a sectional view of a pixel that constitutes the organic light-emitting display device 1 of FIG. 2, according to another embodiment of the present invention. Referring to FIG. 21, the pixel of the organic light-emitting display device 1' according to the present embodiment includes a channel area 2, storage area 3, and an emission area 4. In embodiments, the pixel of the organic light-emitting display device 1' is different from the pixel of the previous embodiment in that the connection electrode 316 is formed on the same plane as the source and drain electrodes 216a and 216b instead of the gate electrode 214.

A TFT as a driving device is formed in the, channel area 2. The TFT includes an activation layer 211, a gate electrode 214, and source and drain electrodes 216a and 216b. A first insulating layer 13 is interposed between the gate electrode 214 and the activation layer 211 so that the gate electrode 214 is insulated from the activation layer 211. In addition, source and drain areas in which high-concentration impurities are implanted are formed in ends of the activation layer 211 and are respectively connected to the source and drain electrodes 216a and 216b.

A storage capacitor Cst is formed in the storage area 3. The storage capacitor Cst includes a first capacitor electrode 311 and a second capacitor electrode 314', and the first insulating layer 13 is interposed between the first capacitor electrode 311 and the second capacitor electrode 314'. The first capacitor electrode 311 may be formed of the same material on the same plane as the activation layer 211 of the TFT. Meanwhile, the second capacitor electrode 314' may be formed of the same material on the same plane as the gate electrode 214 of the TFT.

In the illustrated embodiment, the activation layer 211 of the channel area 2 is formed of polycrystalline silicon, and the first capacitor electrode 311 of the storage area 3 that is formed on the same plane as the activation layer 211 is formed of amorphous silicon. That is, a semiconducting layer formed of amorphous silicon is deposited on the substrate 10, and then crystallization is selectively performed so that the amorphous silicon in the channel area 2 is crystallized into polycrystalline silicon and the amorphous silicon in the storage area 3 is not crystallized.

Also, the organic light-emitting display device 1 may further include a connection electrode 316' that electrically connects the activation layer 211 of the channel area 2 and the first capacitor electrode 311 of the storage area 3. In embodiments, contact holes (see H1 and H2 of FIG. 13) are formed in the first insulating layer 13 and a second insulating layer 15 which cover the activation layer 211 of the channel area 2 and the first capacitor electrode 311 of the storage area 3, and then the contact holes are filled by the connection electrode 316' formed on the first insulating layer 13 and the second insulating layer 15 so that the activation layer 211 of the channel area 2 is electrically connected to the first capacitor electrode 311 of the storage area 3. In embodiments, the connection electrode 316' may be formed of the same material on the same plane as the source and drain electrodes 216a and 216b of the channel area 2.

An organic light-emitting device (EL) is formed in the emission area 4. The organic light-emitting device (EL) includes a pixel electrode 418 connected to one of the source and drain electrodes 216a and 216b of the TFT, an opposite electrode 421 facing the pixel electrode 418, and an intermediate layer 420 interposed between the pixel electrode 418 and the opposite electrode 421. The pixel electrode 418 may be formed of a transparent conductive material.

As described above, according to above embodiments of the present invention, the efficiency of a laser used for crystallization is improved and the maintenance expense for generating the laser is reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
 a thin-film transistor including an activation layer, a gate electrode, a source electrode, and a drain electrode;
 an organic light-emitting device including a pixel electrode electrically connected to the thin-film transistor, an intermediate layer comprising an emissive layer, and an opposite electrode, the intermediate layer being interposed between the pixel electrode and the opposite electrode;
 a storage capacitor comprising a first capacitor electrode, a second capacitor electrode and a first insulating layer interposed between the first and second capacitor electrodes, wherein the first capacitor electrode and the activation layer are on the same plane; and
 a connection electrode electrically connecting between the activation layer and the first capacitor electrode,
 wherein the activation layer comprises polycrystalline silicon, and wherein the first capacitor electrode comprises amorphous silicon.

2. The organic light-emitting display device of claim 1, wherein the connection electrode comprises the same material on the same plane as the gate electrode.

3. The organic light-emitting display device of claim 1, wherein the connection electrode comprises the same material on the same plane as the source and drain electrodes.

4. The organic light-emitting display device of claim 2, wherein the first insulating layer at least partially covers the activation layer and the first capacitor electrode, wherein the connection electrode electrically connects to the activation layer through the first insulating layer, and wherein the connection electrode electrically connects to the first capacitor electrode through the first insulating layer.

5. The organic light-emitting display device of claim 3, further comprising a second insulating layer, wherein the first insulating layer and the second insulating layer at least partially cover the activation layer and the first capacitor electrode, wherein the connection electrode electrically connects to the activation layer through the first insulating layer, and wherein the connection electrode electrically connects to the first capacitor electrode through the first insulating layer.

6. An organic light-emitting display device comprising:
 an activation layer formed on a substrate and a first capacitor electrode that is formed on the same plane as the activation layer and is horizontally spaced apart from the activation layer;
 a first insulating layer at least partially covering the activation layer and the first capacitor electrode;
 a gate electrode formed on the first insulating layer and a connection electrode comprising the same material on the same plane as the gate electrode, wherein the connection electrode is horizontally spaced apart from the gate electrode and electrically connects between the activation layer and the first capacitor electrode;
 a second insulating layer at least partially covering the gate electrode and the connection electrode;
 source and drain electrodes formed on the second insulating layer;
 a second capacitor electrode comprising the same material on the same plane as the source and drain electrodes, wherein the second capacitor is horizontally spaced apart from the source and drain electrodes; and
 an organic light-emitting device comprising a pixel electrode electrically connected to the source and drain electrodes, an emissive layer, and an opposite electrode, wherein the emissive layer is interposed between the pixel electrode and the opposite electrode,
 wherein the activation layer comprises polycrystalline silicon, and wherein the first capacitor electrode comprises amorphous silicon.

7. An organic light-emitting display device comprising:
 a pixel area comprising a plurality of pixels, wherein each of the pixels comprises a thin-film transistor, an organic light-emitting device electrically connected to the thin-film transistor, and a storage capacitor horizontally spaced apart from the thin-film transistor while electrically connected to the thin-film transistor; and
 a circuit area located outside the pixel area and comprising electrical circuits for supplying electric power and data signals to the pixel area,
 wherein a semiconducting layer in the circuit area comprises polycrystalline silicon in the entire semiconductor layer;
 wherein a semiconducting layer in the pixel area comprises a polycrystalline silicon portion and an amorphous silicon portion.

8. The organic light-emitting display device of claim 7, wherein the thin-film transistor of each pixel comprises polycrystalline silicon, and wherein the storage capacitor comprises amorphous silicon.

9. The organic light-emitting display device of claim 7, wherein the polycrystalline silicon of the thin-film transistor is electrically connected to the amorphous silicon of the storage capacitor.

10. A method of manufacturing an organic light-emitting display device, the method comprising:
 providing a semiconducting layer amorphous silicon over a substrate;
 selectively crystallizing a portion of the semiconducting layer to provide a polycrystalline silicon portion and an amorphous silicon portion;
 patterning the semiconducting layer to form an activation layer and a first capacitor electrode, the activation layer comprising the polycrystalline silicon portion, the first capacitor electrode comprising the amorphous silicon portion;
 forming a first insulating layer over the activation layer and the first capacitor electrode.

11. A method of manufacturing an organic light-emitting display device, the method comprising:
 providing an unfinished organic light-emitting display device comprising a pixel area and a circuit area outside the circuit area, wherein both the pixel area and the circuit area comprises an amorphous silicon layer;

when crystallizing the amorphous silicon layer of the circuit area, continuously applying a laser beam to the circuit area; and when crystallizing the amorphous silicon layer of the pixel area, applying a laser beam to a portion of the amorphous silicon layer of the pixel area while not applying a laser beam to another portion of the amorphous silicon layer of the pixel area.

12. The method of claim 11, wherein the selective crystallizing further comprises:

moving a laser generator relative to the substrate;

while relatively moving, selectively applying a laser beam to an area for the polycrystalline silicon portion and not applying a laser beam to an area for the amorphous silicon portion.

\* \* \* \* \*